(12) United States Patent
Turner, Jr. et al.

(10) Patent No.: US 6,781,161 B1
(45) Date of Patent: Aug. 24, 2004

(54) NON-GATED THYRISTOR DEVICE (75) Inventors: Elmer L. Turner, Jr., Grapevine, TX (US); Yong-Fa Alan Wang, Coppell, TX (US)

(73) Assignee: Teccor Electronics, LP, Irving, TX (US)

( * ) Notice: Subject to any disclaimer, the term of this patent is extended or adjusted under 35 U.S.C. 154(b) by 0 days.

(21) Appl. No.: 10/410,317

(22) Filed: Apr. 9, 2003

(51) Int. Cl.[7] .................... H01L 29/74; H01L 21/332
(52) U.S. Cl. ................. 257/109; 257/146; 257/603; 438/133
(58) Field of Search ........................... 257/109, 146, 257/603, 655, 773; 438/133, 380

(56) References Cited

U.S. PATENT DOCUMENTS

| | | |
|---|---|---|
| 3,535,615 A | 10/1970 | Howell et al. |
| 3,621,466 A | 11/1971 | Misawa |
| 3,988,760 A | 10/1976 | Cline et al. |
| 4,047,217 A | 9/1977 | McCaffrey et al. |
| 4,083,062 A | 4/1978 | Ohuchi et al. |
| 4,095,140 A | 6/1978 | Kirkhuff et al. |
| 4,212,019 A | 7/1980 | Wataze et al. |
| 4,216,488 A | 8/1980 | Hutson |
| 4,231,049 A | 10/1980 | Pearsall |
| 4,616,247 A | 10/1986 | Chang et al. |
| 4,685,120 A | 8/1987 | Norris et al. |
| 4,722,908 A | 2/1988 | Burton |
| 4,827,497 A | 5/1989 | Norris et al. |
| 4,878,095 A | 10/1989 | Bending et al. |
| 4,914,045 A | 4/1990 | Webb et al. |
| 5,003,366 A | 3/1991 | Mishima et al. |
| 5,247,230 A | 9/1993 | Michaud |
| 5,479,031 A | 12/1995 | Webb et al. |
| 6,015,999 A | 1/2000 | Yu et al. |
| 6,084,253 A | 7/2000 | Turner et al. |
| 6,424,125 B1 | 7/2002 | Graham |
| 6,531,717 B1 | 3/2003 | Casey et al. |
| 6,600,204 B2 * | 7/2003 | Einthoven et al. .......... 257/497 |

OTHER PUBLICATIONS

Baliga, B. Jayant, "Power Semiconductor Devices",PWS Publishing Co., 1996, p. 217.
Blicher, Adolph, "Thyristor Physics", Springer–Verlag, 1976, pp. 277–289.
Vassilevski, Konstantin V., et al., "Experimental Determination of Electron Drift Velocity in 4H–SiC p+–n–n Avalanche Diodes", IEEE Electron Device Letters, vol. 21, No. 10, Oct. 2000, pp. 485–487.

* cited by examiner

*Primary Examiner*—Mark V. Prenty
(74) *Attorney, Agent, or Firm*—Roger N. Chauza, Esq.; Chauza & Handley, LLP (57) ABSTRACT

A semiconductor device with two epitaxial layers formed on a substrate. The middle layer of epitaxial material can be formed thin and with an appropriate doping concentration to provide a low avalanche breakdown voltage with a negative resistance characteristic. The top layer of epitaxial material is doped with the same concentration as the substrate to provide a two-terminal thyristor device with symmetrical bidirectional operating characteristics.

34 Claims, 5 Drawing Sheets

NON-GATED THYRISTOR DEVICE

TECHNICAL FIELD OF THE INVENTION

The present invention relates in general to semiconductor devices, and more particularly to non-gated thyristor devices.

BACKGROUND OF THE INVENTION

Silicon controlled rectifiers (SCRs) and triacs are part of the gated thyristor family that are fabricated as respective four-layer and five-layer devices that can function to control AC circuits, such as light controls, dimmer circuits, power pulse circuits, voltage references in AC power circuits, motor control circuits, etc. Many of these AC circuits are controlled by triggering the gated thyristor devices at desired phase angles of the AC voltage. Rather than triggering these gated thyristor devices directly from the AC power, such gated thyristor devices are more efficiently triggered by two-terminal thyristor devices, known sometimes as diacs, sidacs or silicon trigger switches (STS). Diacs and sidacs are commercially available from Teccor Electronics of Irving, Tex.

Figure 1A:
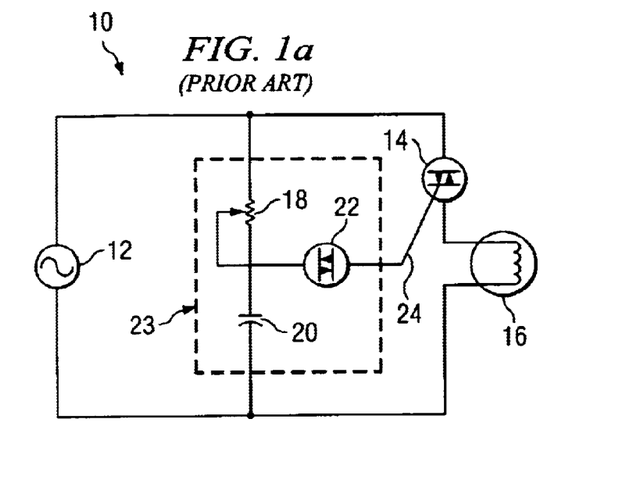
FIG. 1a is a schematic diagram of a light dimmer circuit employing a two-terminal thyristor device.

A conventional phase angle control circuit 10 used as a light dimmer is shown in FIG. 1a. An AC source 12 of power, such as 110 VAC, is coupled to a triac 14 which is in series with an incandescent light bulb 16. The triac 14 can be triggered into conduction at various magnitudes of the AC voltage, e.g., at different phase angles, to thereby control the intensity of the light emitted by the light bulb 16. The triggering of the triac 14 to control the intensity of the light is carried out by the use of an RC network which includes a potentiometer 18 and a capacitor 20, together with a diac 22. The diac 22 has a negative resistance characteristic that makes it well suited for use in triggering gated thyristors. The breakover voltage ($V_{BO}$) for many diacs used in 110 VAC applications is in the range of about 27–70 volts. The potentiometer 18 is adjustable for varying the intensity of the light emitted from the light bulb 16. As the resistance (that is in series with the capacitor 20) increases, there is an increased delay into each AC cycle before the diac 22 triggers the triac 14 into conduction. Once triggered into conduction, the triac 14 conducts AC current to the light bulb 16 for the remainder of the AC cycle. The shorter the duration of the AC cycle in which the triac 14 conducts, the dimmer the light becomes.

Figure 1B:
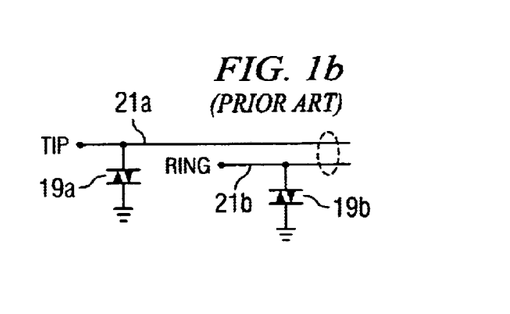
FIG. 1b is circuit diagram of a telephone line circuit employing two-terminal thyristor devices to provide overvoltage protection functions.

FIG. 1b illustrates a circuit configuration using sidacs 19a and 19b with respective telephone lines 21a and 21b to provide overvoltage protection thereto. Indeed, sidacs can be used to provide overvoltage protection functions, clamping functions and many other similar functions in numerous other types of circuits. Sidacs are available with breakover voltages in the range of about 6 volts to about 330 volts. The first sidac 19a is connected between ground and a telephone line tip conductor 21a to provide overvoltage protection thereto. Similarly, the second sidac 19b is connected between ground and the telephone line ring conductor 21b to provide overvoltage protection thereto. Various other configurations of sidacs and associated components can be coupled in a network between the telephone line conductors 21a and 21b to provide overvoltage protection functions. When a voltage carried by the telephone line conductor exceeds the breakover voltage of the sidac, the sidac is driven into conduction to thereby clamp the telephone line conductor to a low voltage level. A negative resistance characteristic of the sidac provides a low voltage drop across the two terminals thereof, thereby lowering the power developed by the sidac during conduction of the overvoltage energy.

Figure 2:
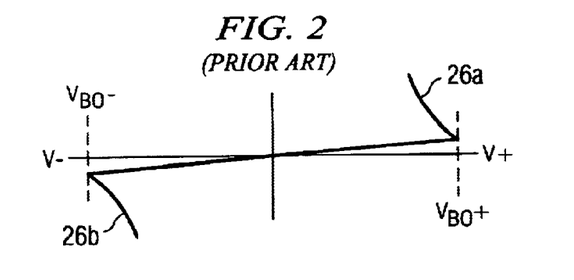
FIG. 2 graphically depicts the voltage/current characteristic of a traditional two-terminal thyristor device used for triggering a gated thyristor into conduction, or for providing overvoltage protection functions.

The diac 22 and sidacs 19a and 19b are two-terminal thyristor devices that have a voltage/current characteristic generally shown in FIG. 2. When a voltage of a magnitude between the positive breakover voltage+$V_{BO}$ and the negative breakover voltage-$V_{BO}$ is applied across the two-terminal thyristor device, such device remains in a non-conductive state. The breakover voltage of a two-terminal thyristor can be exceeded by overvoltages, AC-derived signals, or many other types of signals. Once the breakover voltage is reached, the two-terminal thyristor device conducts and enters into its negative resistance region 26. Here, the voltage across the device is less than the breakover voltage. This feature can be used as an advantage in many applications.

The importance of the negative resistance region 26 is that the voltage across the two-terminal thyristor device decreases for increasing current through the device. The phenomenon of avalanche current flow through the two-terminal thyristor device causes the negative resistance characteristic 26. The power developed by the device is less, thus allowing the device to be made smaller in size. With a lower on-state voltage across the two-terminal device, a pulse of current can be provided to more efficiently trigger a triac or other device into conduction.

With conventional two-terminal thyristor devices, the voltage across the device typically decreases about two volts once it fully enters its negative resistance region 26. The dynamic resistance of the device in the negative resistance region 26 determines the extent by which the voltage across the two-terminal thyristor device decreases once the breakover voltage is exceeded. With a larger negative resistance, there is a larger difference in the voltage drop across the two-terminal thyristor device at breakover and after breakover.

In the light dimmer application of FIG. 1a, after the diac 22 enters the negative resistance region 26a or 26b, the sudden decrease in voltage across the diac 22 causes an additional voltage (about two volts) to be placed on the gate 24 of the triac 14. The diac circuit 23 thus produces a current pulse to quickly turn on the triac 14 so that the triac gate current does not languish through its turn-on transition. Less power is thus developed across the triac 14 itself. Once the triac 14 is driven into conduction by the diac circuit 23, the AC power for the remaining portion of the AC cycle drives the light bulb 16. Once the AC voltage passes through a zero crossing and the holding current of the triac 14 is no longer sustained, the triac 14 stops conducting current and remains in an off-state until triggered again in the next AC cycle by the current pulse from the diac circuit 23.

The design considerations of a diac, sidac or STS generally require that they be full wave, i.e., bidirectional devices, so that operation occurs during both the positive and negative cycles of the AC voltage. Moreover, the voltage/current characteristics should be symmetrical for both positive and negative trigger currents. This means that the positive and negative breakover voltages should be substantially the same magnitude. While more difficult to achieve, the break back or negative resistance characteristic 26 should exhibit a low dynamic resistance characteristic to provide a correspondingly larger current pulse to the gated thyristor to be triggered. When utilized for clamping functions, the negative resistance characteristic of the two-terminal thyristor device reduces the voltage across the device during conduction, thereby reducing the power dissipation requirements of the device.

Figure 3:
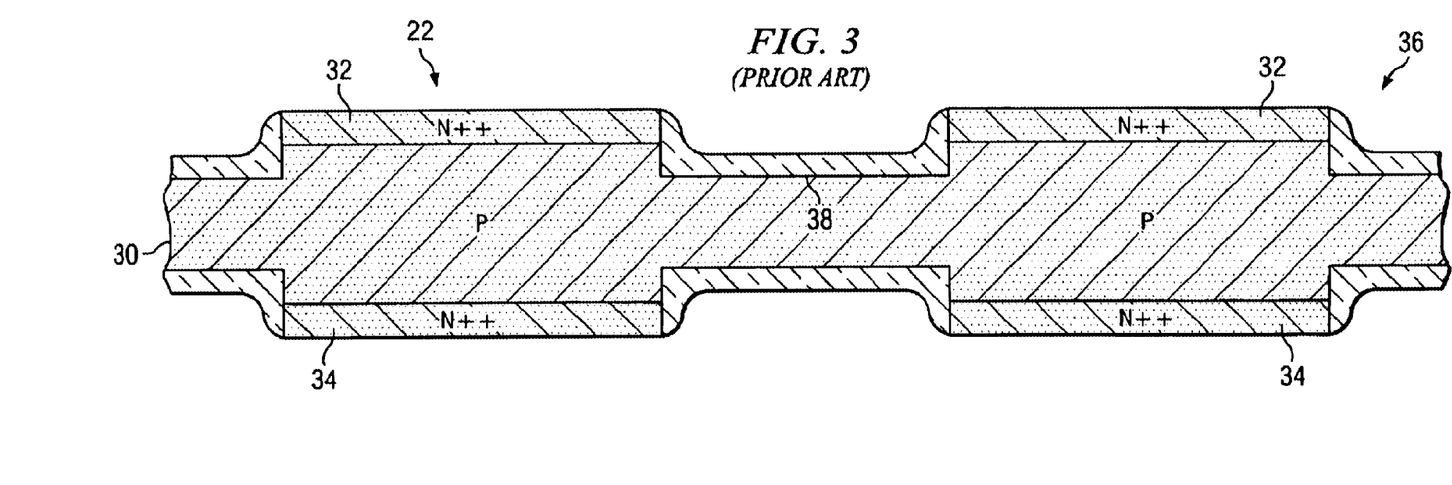
FIG. 3 is a partial cross-sectional view of a wafer that has been processed in a well-known manner to fabricate two-terminal thyristor devices.

A two-terminal thyristor device constructed according to the prior art is shown in FIG. 3. Two-terminal thyristor devices are generally three-layer devices, including a p-type midregion 30 and heavily doped n-type regions 32 and 34 diffused into opposite sides of a semiconductor wafer 36. The concentration of the n-type impurities is related to the magnitude of the breakover voltage of the two-terminal thyristor device. The wafer 36 is masked, and then etched through the top and bottom n-type regions 32 and 34, down into the p-type midregion 30. The mask defines the boundaries of each chip of the wafer 36. The etching process thins the wafer 36 around each chip. Two of the many chips formed on the wafer 36 are shown in FIG. 3. The thinned regions 38 that circumscribe each chip of the wafer 36 are then filled with a standard passivation glass to form a protective layer around each chip of the wafer 36. As can be appreciated, the beginning thickness of the wafer 36 and the amount to which it is thinned around each chip, determines how much flexing the wafer 36 can withstand before the semiconductor material breaks. Six-inch diameter wafers are more easily broken than a smaller diameter wafers of the same thickness. Because many more chips can be formed on a six-inch wafer than on a smaller diameter wafer, a broken six-inch wafer presents a much larger negative impact on production.

As noted above, two-terminal thyristor devices are constructed to exhibit a negative resistance characteristic after the breakover voltage has been exceeded. The extent of the negative resistance characteristic is a function of the thickness of the midregion 30. With a thinner midregion 30, the dynamic resistance of the negative resistance characteristic is reduced, thereby providing a greater difference in the voltage drop across the two-terminal thyristor device before conduction and after breakover has been achieved. It is apparent that devices with thinner midregions 30 are more desirable, as the current pulse delivered to gated thyristors provides more electrical energy to trigger the gated thyristors into conduction. In other applications, the negative resistance characteristic reduces the voltage across the two-terminal, thereby allowing the device to either carry more current, or be made smaller.

The midregion 30 of the two-terminal thyristor wafers 36 can be thinned either by starting with a thinner wafer 36, or by lapping the wafer 36 for mechanically removing the semiconductor material. However, in order to maintain a low incidence of breakage for thin wafers 36 due to handling, the wafer diameter must be small. This is a distinct disadvantage, as more wafers must be processed in order to produce a given number of chips, as compared to the use of larger-diameter wafers. As an alternative, the n-type regions 32 and 34 can be diffused further into the midregion 30 to effectively reduce the thickness of the midregion 30. This alternative requires more processing time during the diffusion and drive steps, and it is more difficult to control the effective thickness of the midregion 30 and thus control the dynamic resistance of the negative resistance characteristic.

In fabricating low breakover voltage devices by deep diffusion techniques, such process often becomes counter-productive as the deeper the diffused dopants are driven into the chip, the resulting junction breakover voltages increase. This is because the dopant concentration resulting from the diffusion process decreases as a function of the distance from the surface of the chip. With lower dopant concentrations, the breakover voltages increase.

From the foregoing, it would be commercially advantageous to be able to make two-terminal thyristor devices with thin midregions and well-defined avalanche capabilities, while using large diameter wafers.

SUMMARY OF THE INVENTION

In accordance with the principles and concepts of the invention, disclosed is a semiconductor device formed with one or more epitaxial layers to accurately control the impurity concentration therein and the thickness of the layer(s), thereby achieving low breakover voltages together with negative resistance characteristics. The utilization of one or more epitaxial layers formed on a thick semiconductor substrate allows larger-diameter wafers to be used to fabricate a correspondingly larger number of chips per wafer.

In accordance with one embodiment of the invention, disclosed is a two-terminal thyristor device having at least one thin epitaxial layer formed on a semiconductor substrate to provide an avalanche breakdown function and thus provide negative resistance characteristics. A semiconductor layer of material is formed over the epitaxial layer. These three semiconductor layers can be formed to provide a diac, a sidac, STS, or other thyristor device having a low avalanche breakdown voltage. The middle layer of the device is preferably a thin epitaxial layer having a non-uniform gradient of a first dopant type. The top semiconductor layer and the substrate are doped with substantially equal concentrations of the same type of a second dopant type to provide substantially equal positive and negative breakover voltages. As an alternative, the top semiconductor layer can also be formed by epitaxial methods.

In accordance with another feature of the invention, the thin middle epitaxial layer enables the device to exhibit a low dynamic negative resistance characteristic, without having to compromise the thickness of the substrate and thus the mechanical strength of the wafer.

In accordance with another aspect of the invention, only three semiconductor layers are necessary, including the substrate itself, in order to efficiently provide a low breakover voltage device and with negative resistance characteristics.

In accordance with yet another feature of the invention, a two-terminal thyristor device can be efficiently fabricated to function as a negative resistance device for triggering AC circuits, or providing overvoltage protection functions.

In accordance with another important feature of the invention, a bidirectional thyristor device is disclosed, with substantially equal-size top and bottom metal contacts. This provides a more symmetrical breakover voltage of both pn junctions, irrespective of the rise times of the voltages applied across the semiconductor device.

In accordance with yet another feature of the invention, three epitaxial layers can be used to provide two pn junctions having symmetrical breakover voltage characteristics. In this embodiment, the type of semiconductor substrate used is less critical.

In accordance with one embodiment, disclosed is a semiconductor device including a semiconductor material doped with an impurity of a first polarity, and an epitaxial layer formed on the semiconductor material. The epitaxial layer is doped with an impurity of a second polarity that is opposite the first polarity of the semiconductor material. The epitaxial layer has a thickness sufficient to provide avalanche breakdown. A semiconductor layer is then formed on the epitaxial layer, where the semiconductor layer is doped with an impurity of the same polarity as the semiconductor material. A first junction is formed between the semiconductor material and the epitaxial layer, and a second junction formed between the epitaxial layer and the semiconductor layer.

According to another embodiment, disclosed is a semiconductor device which includes a semiconductor material, and a first epitaxial layer formed on the semiconductor material, where the first epitaxial layer has a thickness suitable for providing avalanche breakdown thereof. A first pn junction is formed at an interface between the semiconductor material and the first epitaxial layer. The first pn junction is formed to provide a given breakdown voltage. A second epitaxial layer is formed on the first epitaxial layer. A second pn junction is formed at an interface between the first epitaxial layer and the second epitaxial layer. The second pn junction is formed to also provide a breakdown voltage substantially equal to the given breakdown voltage. A first metallic contact is formed on a surface of the semiconductor material, and a first terminal is connected to the first metallic contact. A second metallic contact is formed on a surface of the second epitaxial layer, and a second terminal connected to the second metallic contact.

According to yet another embodiment, disclosed is a method of forming a semiconductor device. The method includes the steps of forming on a semiconductor material a first epitaxial layer so that a pn junction is formed therebetween. The first epitaxial layer and the semiconductor material are formed with opposite polarity dopants. The first epitaxial layer is formed with a thickness sufficient to provide negative resistance properties for the semiconductor device. A second epitaxial layer is formed on the first epitaxial layer so that a pn junction is formed therebetween. The second epitaxial layer is formed with a dopant polarity the same as that of the semiconductor material.

According to another embodiment of the invention, disclosed is a semiconductor device having at least three semiconductor layers for forming two pn junctions, two of the semiconductor layers being of one type dopant polarity and another semiconductor layer being of an opposite type dopant polarity. Material characteristics of the semiconductor layers are selected and arranged so as to exhibit substantially equal breakover voltages of the two pn junctions. As such, one pn junction is forward biased when a voltage of a given polarity is applied across the semiconductor device, and the other pn junction is forward biased when a voltage of an opposite polarity is applied across the semiconductor device. A first metal contact is formed on one side of said semiconductor device in electrical contact with one semiconductor layer. A second metal contact is formed on an opposite side of the semiconductor device in electrical contact with another semiconductor layer. The first and said second metal contacts are constructed with substantially the same size surface areas to provide symmetry of the breakdown voltages of the pn junctions.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, functions or elements throughout the views, and in which.

DETAILED DESCRIPTION OF THE INVENTION

Figure 4:
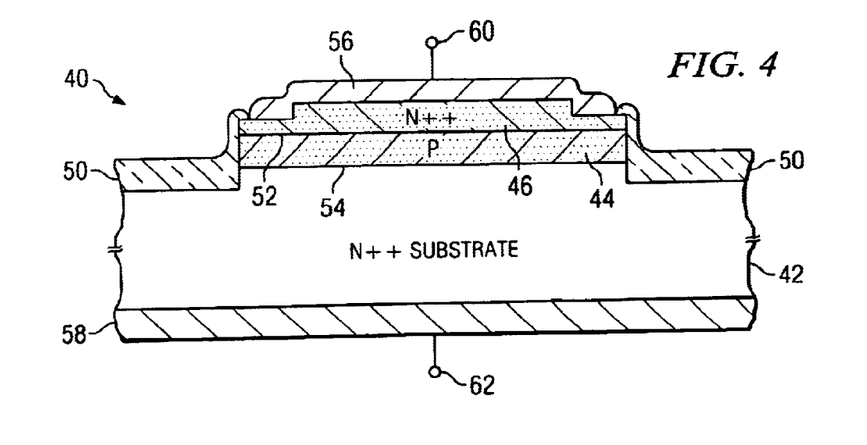
FIG. 4 is a partial cross-sectional view of a chip from a wafer processed to provide a two-terminal thyristor device according to the features of the invention.

With reference to FIG. 4, a completed chip 40 is illustrated in cross section with semiconductor regions functioning as a two-terminal thyristor device. According to one embodiment of the invention, the semiconductor chip 40 is constructed as a square device. When viewed from the top thereof, the chip 40 has a side dimension of about 22 mils. The bulk of the semiconductor chip is comprised of a heavily doped silicon substrate 42. The substrate 42 is preferably doped with an n-type impurity such as arsenic to obtain a resistivity between about 0.003 ohm*cm and 0.005 ohm*cm. The n and p-type impurities are sometimes referred to as an impurity with a particular type of polarity. In the illustrated embodiment, the starting thickness of the substrate 42 is about 500 microns thick.

In accordance with an important feature of the invention, the semiconductor chip 40 is processed to form a first epitaxial layer 44 on the top surface of the substrate 42, and a second epitaxial layer 46 on the first epitaxial layer 44. The first epitaxial layer 44 is preferably grown to a thickness of about 15 micron with a p-type impurity concentration resulting in a resistivity of about 0.7 ohm*cm. Preferably, the resistivity is in the range between about 0.6 ohm*cm and 0.8 ohm*cm. Boron can be used to provide the p-type impurity in the first epitaxial layer 44. The second epitaxial layer 46 is preferably grown to a thickness of about 25 micron with an n-type impurity concentration to achieve a resistivity between about 0.003 ohm*cm and 0.005 ohm*cm. Arsenic can be used to provide the n-type impurity in the second epitaxial layer 46. In order to achieve symmetry of operation with respect to both positive and negative voltages, the dopant concentration of the top epitaxial layer 46 should be the same as the dopant concentration of the substrate 42.

The semiconductor junctions 52 and 54 formed at the upper and lower interfaces of the p-type epitaxial layer 44 are each characterized as abrupt junctions. This is primarily the result of the junctions being formed at the interface of the epitaxial layers, rather than being formed by diffusion techniques. An abrupt junction is formed when the dopant profile changes abruptly at the junction. The semiconductor material of the epitaxial layers thus forms abrupt gradient pn junctions 52 and 54. An abrupt pn junction allows the two-terminal thyristor devices to be made with lower breakover voltages. The breakover voltage of a device of the invention is also a function of the doping level of the middle epitaxial layer 44.

Heretofore, thin p-type layers with low breakover voltages were difficult to make with semiconductor regions formed by diffusion techniques. This is because as the junction breakdown voltage is lowered, higher impurity concentration semiconductor regions are required. With high concentration p and n-type regions, it is difficult to achieve a thin middle region in chips. The high temperatures required to diffuse high concentrations of impurities deep into the semiconductor substrate makes it difficult to achieve tight process controls to obtain thin middle layers of high concentration semiconductor material with low breakdown voltages. With a thin epitaxial layer 44 of an appropriate dopant concentration, low breakover voltages on the order of 6–8 volts can be realized.

A conventional passivation glass material 50 can used to seal the two pn junction 52 and 54 from the environment. Lastly, top and bottom metal contacts 56 and 58 are formed on respective top and bottom surfaces of the semiconductor chip 40. A metal such as nickel is well adapted for deposition on highly doped semiconductor surfaces. Since the chip 40 shown in FIG. 4 operates in a bidirectional and symmetrical manner, there is no functional distinction between the metal terminals 60 and 62.

While in the preferred embodiment the top epitaxial layer 46 is formed by epitaxial means, those skilled in the art may find that the formation of such layer can be carried out by diffusion means. However, it has been found that when the top layer 46 is formed as an epitaxial layer, the processing temperatures used do not appreciably alter the dopant distribution at the junctions 52 and 54. This is because epitaxial processing temperatures are generally about 1100 degrees Centigrade, whereas diffusion processing temperatures can reach 1200 degrees Centigrade or higher. The processing time of a wafer in an epitaxial chamber is much less than a wafer in a diffusion furnace. As higher processing temperatures and durations are encountered, the dopant impurities in the semiconductor material tend to diffuse and change the concentration gradient. In any event, it is envisioned that the invention can be made using a middle epitaxial layer and an upper non-epitaxial layer.

The two-terminal thyristor chip 40 operates in the following manner. When the bottom terminal 62 is biased with a small positive voltage with respect to the top terminal 60, the bottom pn junction 54 is reverse biased and the top pn junction 52 is forward biased. No current flows through the two-terminal thyristor chip 40 because of the reversed biased junction 54. It is noted that irrespective of which direction the two-terminal thyristor chip 40 is biased, one or the other of the pn junctions 52 or 54 will be reverse biased. It is the avalanche breakdown of the reverse biased junction that allows the two-terminal thyristor chip 40 to conduct current. As noted above, the extent by which the voltage across the two-terminal thyristor chip 40 is reduced in the negative resistance region after breakover, is determined in a large part by the thickness of the middle semiconductor layer 44.

When the voltage across the chip 40 is increased to an extent that it exceeds the breakover voltage, the device undergoes avalanche breakdown. This type of breakdown is caused by impact ionization of electron-hole pairs. When the pn junction 54 is reverse biased sufficiently, e.g. at the junction breakdown voltage point, the electric field in the depletion region of the junction 54 is very high. Electron/hole pairs that enter the depletion region of the reverse biased junction 54 are influenced by the electric field and undergo a substantial acceleration. The accelerated electron/hole pairs collide with the silicon atoms and dislodge electrons from their bonds with the silicon atoms. This creates additional electron/hole pairs and thus additional current. As the secondary carriers are accelerated into the depletion region, they collide with other silicon atoms, and the process multiplies the number of carriers generated. The junction 54 thus becomes conductive in the reverse direction, and together with the forward biased junction 52, current is allowed to flow from terminal 62 to the other terminal 60 of the device. The avalanche phenomenon produces the negative resistance region 26 of the characteristic voltage/current curve shown in FIG. 2.

The other state of operation of the semiconductor chip 40 is when the terminal 60 is biased positive with respect to the terminal 62. In this situation, the top junction 52 is reverse biased and the bottom junction 54 is forward biased. The top junction 52 undergoes avalanche breakdown when the voltage across the semiconductor chip 40 exceeds the breakover voltage. When this occurs, the device conducts current from the terminal 60 to the terminal 62. The semiconductor chip 40 thus operates in a bidirectional manner, with breakover characteristic that are symmetrical. The symmetrical operational characteristics of the semiconductor chip 40 are a function of the same doping concentration in the epitaxial layer 46 and the substrate 42, as well as the impurity concentration profiles adjacent the junctions 52 and 54.

While the foregoing semiconductor chip 40 has been described as being fabricated with a p-type epitaxial region 44, such region 44 can be formed with an n-type epitaxial material. In the event that the middle epitaxial layer 44 is formed with n-type material, then the substrate 42 and the top layer 46 would be formed with a $P^{++}$ semiconductor material. In other words, because the middle layer is formed very thin by epitaxial methods, the choice of the type of impurity employed in the middle layer 44, in view of the mobility of the minority carriers, is of less concern. Because epitaxial layers 44 and 46 are used instead of diffused regions, thin semiconductor layers can be used without compromising the strength of the wafer. Breakover voltages as low as 6–8 volts, and even lower, with negative resistance operation, are believed possible with the use of the invention. Preliminary tests have shown that non-symmetrical breakover voltages have been achieved, together with negative resistance operation, where one breakdown voltage was measures at 16 volts. The uniform concentration of dopants or impurities in both the substrate 42 and the middle layer 44 produce a sharp junction gradient, thereby providing a lower breakdown voltage for the device. Again, the avalanche breakdown voltage of the lower junction 54 is also a function of the dopant concentration of the middle layer 44.

Figure 5:
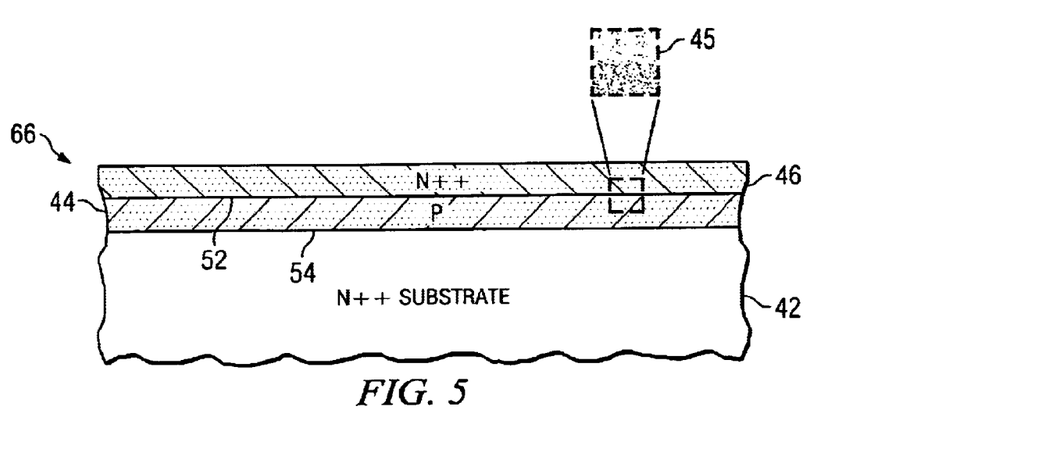
FIGS. 5–10 are a series of partial cross-sectional views of a wafer during various steps of the process according to the invention.

With reference now to FIG. 5, a portion of a semiconductor wafer 66 is shown during the initial fabrication stages thereof. The following process steps provide the completed chip 40 described above in connection with FIG. 4. The wafer is selected to have an n-type arsenic concentration resulting in a resistivity between about 0.003 ohm*cm and 0.005 ohm*cm throughout the wafer 66. The initial thickness of the wafer is about 500 microns. This thickness is ample for withstanding normal handling of 4-inch or 6-inch wafers without breakage. The wafer 66 is then placed in an epi reactor, whereupon the p-type epitaxial layer 44 is grown on the top surface of the wafer 66. The p-type epitaxial layer 44 is grown so that the p-type impurity (boron) is distributed throughout the thickness of the layer 44. In order to provide symmetrical operation with respect to positive and negative voltages, a first or bottom portion of the epitaxial layer 44 is formed with a dopant concentration that is greater than that of the top portion of the epitaxial layer 44. The boron or other p-type impurity is distributed during the initial epitaxial growing process so as to achieve a resistivity in the bottom part of the p-type layer 44 of about 0.7 ohm*cm. With the impurity concentration of the p-type layer 44 being less than that of the substrate 42, the depletion region that is formed at the junction 54 during reverse bias conditions extends into the p-type region 44 a distance more than into the n-type substrate 42.

The epitaxial process is then modified to deposit the epitaxial silicon in the upper portion of the layer 44 with a lighter concentration. Preferably, the dopant concentration in the upper portion of the epitaxial layer 44 produces a resistivity of about 0.6 ohm*cm for 32-volt breakover voltage operation. The more lightly doped top portion of the epitaxial layer 44 permits the breakdown voltage of the top junction 52 to more closely match the breakdown voltage of the bottom junction 54. The enlargement 45 depicts the different concentrations of the p-type dopants in the epitaxial layer 44.

The middle epitaxial layer 44 can also be made arbitrarily thin to achieve low breakover voltages. Indeed, it is anticipated that for a device with a breakover voltage of 10 volts, the p-type epitaxial layer 44 can be made as thin as a micron. The substrate can nevertheless be made sufficiently thick to provide mechanical strength to the wafer 66.

Subsequent to the growth of the p-type epitaxial layer 44, the wafer is placed in an epi reactor for forming the top n-type epitaxial layer 46. The n-type epitaxial layer 46 is grown to a depth of about 25 microns and with an n-type impurity concentration to achieve a resistivity between about 0.003 ohm*cm and 0.005 ohm*cm, preferably the same resistivity as that of the substrate 42. The $N^{++}$ designation indicates that the semiconductor material is heavily doped. As noted above, the same impurity concentration in both the top n-type epitaxial layer 46 and the substrate 42 provides symmetry to the bidirectional operation of the semiconductor chip 40.

Figure 6:
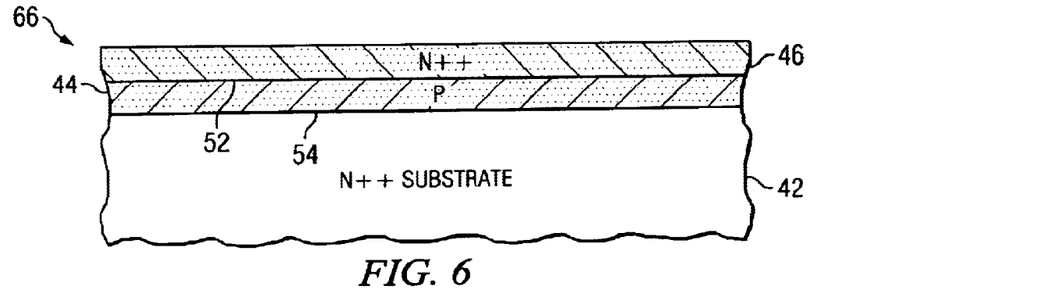

FIG. 6 illustrates the wafer 66 after the next processing step according to an embodiment of the invention. Here, the semiconductor substrate 42 has been reduced in thickness. Thinner chips are easier to process in conventional chip handling equipment, such as multi-apertured vacuum plates which receive and relocate thin chips more accurately than cubic-shaped chips. A conventional lapping process is used to remove a sufficient amount of material on the backside of the wafer 66 to provide an overall thickness of the substrate 42 and the epitaxial layers of about 240 microns. Although a mechanical grinding process is used to reduce the thickness of the wafer 66, other chemical etching processes could be used. An advantage to the use of the mechanical lapping process is that it does not subject the wafer to any additional high temperature process steps. This leaves the junction dopant profiles undisturbed.

Figure 7:
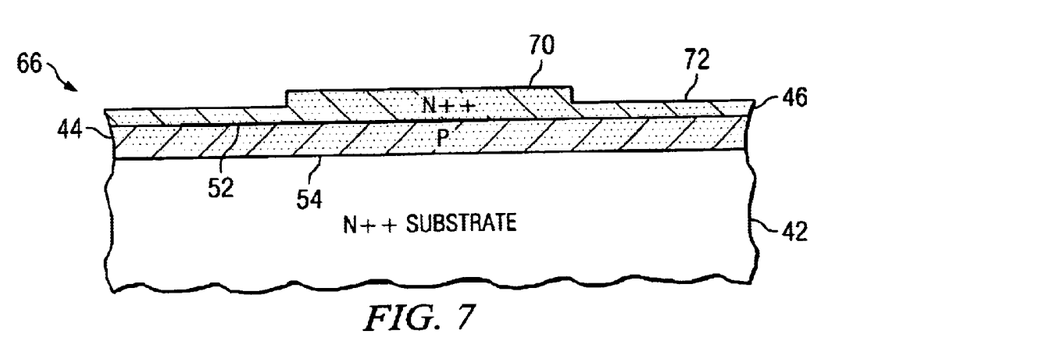

Processing of the wafer 66 continues, as shown in FIG. 7. The top surface of the n-type epitaxial layer 46 is masked with a growth of silicon dioxide ($SiO_2$) and then etched to leave square islands in the mask material. The wafer is then etched again with a selective etchant which does not etch the $SiO_2$, but which readily etches the silicon material of the n-type epitaxial layer 46. The unmasked portion of the n-type epitaxial layer 46 is etched down to a depth of about 10–15 microns. The $SiO_2$ mask is then removed by conventional etchants that are selective as to the silicon dioxide material. The result is shown in FIG. 7. The raised or pedestal portion 70 of the n-type epitaxial layer 46 provides an area for making contact with one side of the semiconductor chip 40.

Figure 8:
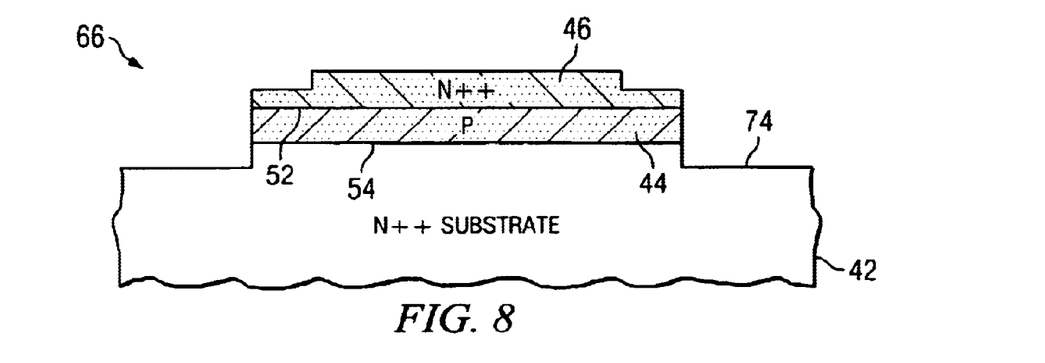

In FIG. 8 the wafer 66 is shown after additional processing steps. The top of the wafer 66 is again masked with a $SiO_2$ mask. The exposed portions of the wafer 66 are etched through both the top junction 52 and the bottom junction 54, down into the substrate 42. This processing step provides isolation of the edges of the junctions 52 and 54 from the substrate 42. The thinned area 74 of the wafer 66 around each island of epitaxial material forms a web between each semiconductor chip 40 of the wafer. The thickness of the thinned area 74 is about 175 microns thick, which is sufficient for handling of a large diameter wafer 66 without undue breakage.

Figure 9:
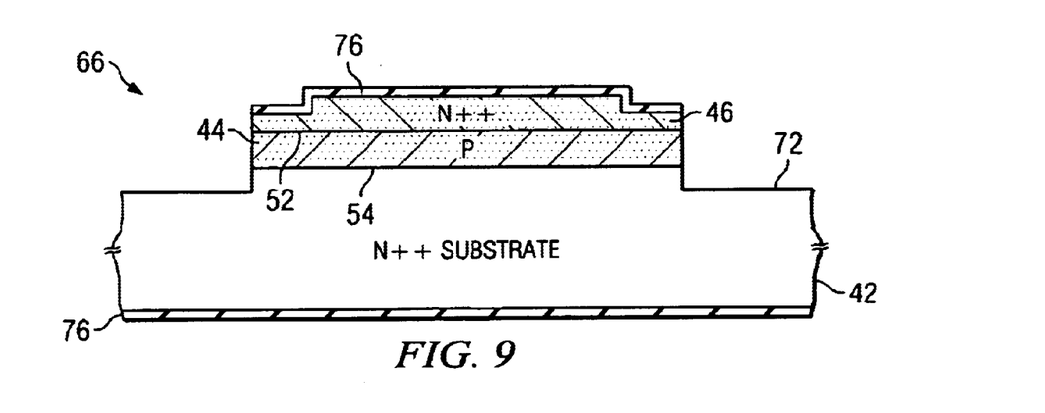

With reference to FIG. 9 shown is the result of a processing step where a layer of $SiO_2$ forms a mask 76 over selected areas of the top side of the wafer 66. The silicon dioxide mask 76 covers only the top surface of the n-type epitaxial layer 46. During the mask forming step, the $SiO_2$ material 76 is also formed according to this embodiment on the entire bottom surface of the wafer 66. This processing step prepares the wafer 66 for the formation of a passivation layer to provide environmental protection to otherwise exposed portions of the semiconductor chip 40.

Figure 10:
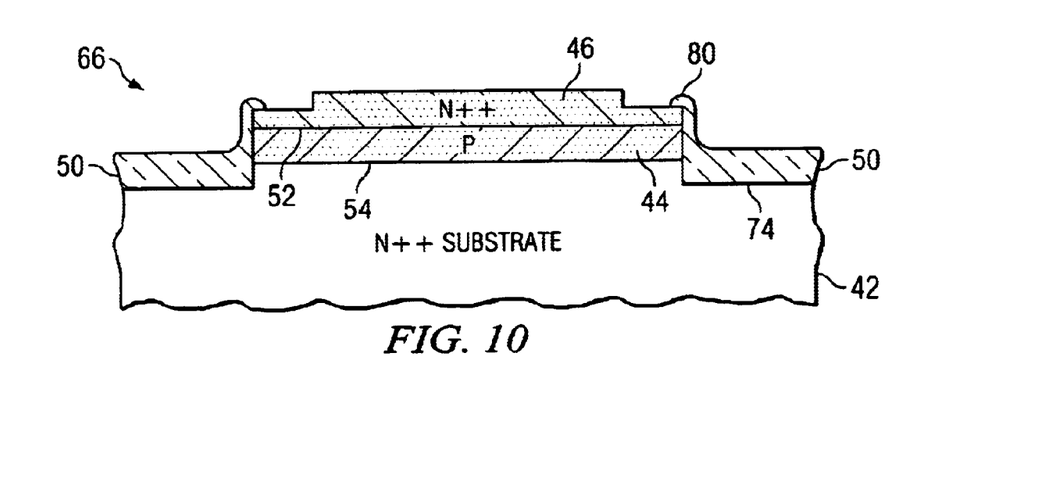

Subsequent to the masking of the wafer 66 as described above, the wafer 66 is passivated with a layer of a passivation material 50. The passivation material 50 covers the unmasked-areas of the semiconductor chip 40, namely in the web areas 74 surrounding each semiconductor chip 40 of the wafer 66. This is shown in FIG. 10. During the passivation process, the passivation material 50 is formed on the vertical sides of the epitaxial layers 44 and 46, and even somewhat on the top peripheral edge of layer 46 to thereby form a rim 80. This provides an excellent hermetic seal to the boundary edges of the semiconductor junctions 52 and 54. It is important to note that reliable contact with the metal contact 56 is assured when the top surface of the metal contact 56 is flat and extends away from the chip more than the rim 80 of the passivation material 78.

Lastly, metal contacts are deposited on those surface areas of the wafer 66 that are not covered by the glass passivation material 50. This is shown in the completed semiconductor chip 40 of FIG. 4. The top surface of the n-type epitaxial layer 46 is covered with a conductive metal 56, such as nickel. In the embodiment shown in FIG. 4, the entire bottom surface of the semiconductor chip 40 is covered with a layer of the conductive metal 58. As noted above, electrical connection is made to the opposite sides of the semiconductor chip 40 via terminals 60 and 62.

Figure 11:
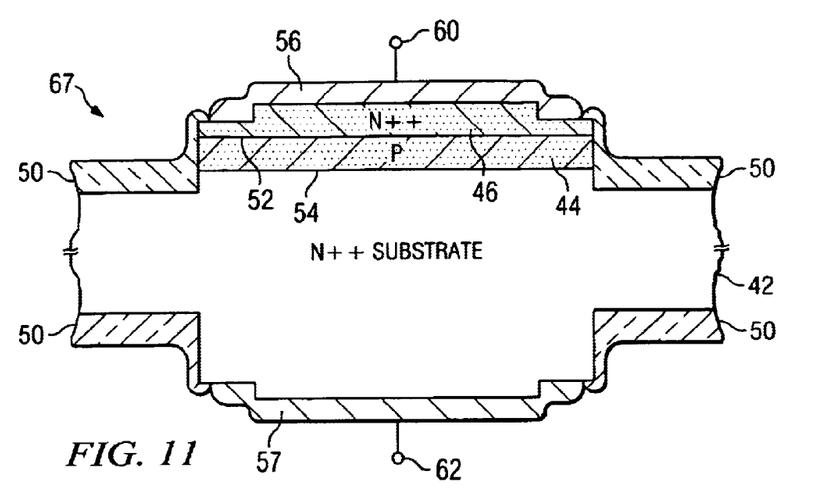
FIG. 11 is a cross-sectional view of another embodiment of a two-terminal thyristor device subsequent to symmetrical etching of both sides of the chip.

FIG. 11 illustrates an embodiment of a semiconductor chip 67 that is substantially similar to the semiconductor chip 40 of FIG. 4, but is constructed in a manner that provides symmetry of the top and bottom metal contacts. In FIG. 11, the bottom surface of the semiconductor substrate 42 is etched using the same masks and etchants as used in etching the epitaxial layers 44 and 46. In like manner, the same masks are used for the top and bottom surfaces of the semiconductor chip 67 for forming the passivation glass material 50 thereon. As a result, the physical shape of the top and bottom surfaces of the semiconductor chip 67 is the same. Rather than covering the entire bottom surface of the semiconductor chip 67 with a metal layer, only the openings in the passivation glass material 50 have a metal 57 deposited therein. A terminal wire 62, lead frame or other package connection can be connected to the metal contact 57.

With this arrangement, the top and the bottom of the semiconductor chip 67 are symmetrical and substantially indistinguishable. When the chips are bidirectional with symmetrical operating characteristics, the physical orientation of the semiconductor chip 67 in a circuit is not a concern. This facilitates positioning of the semiconductor chip 67 in chip handling machines which place the chips on circuit boards. Without having to position the chips in a certain orientation, as would be required with the chip arrangement of FIG. 4, chip handling is facilitated. In addition, chip packaging is also made easier.

In accordance with another important feature of the embodiment of FIG. 11, the symmetry of the electrical operation of the semiconductor chip 67 is enhanced. It has been found that when the semiconductor chip 40 of FIG. 4 is subjected to positive and negative breakdown voltages applied across the device, with differing ramp slopes or rise times, the breakdown voltage of the bottom pn junction 54 was sensitive to the rise time of the voltage. Indeed, the breakdown voltage of the bottom pn junction 54 decreased for increasing rise times of the voltage applied across the semiconductor chip 40. On the other hand, the breakdown voltage of the top pn junction 52 was not sensitive to the rise time of the voltage applied across the semiconductor chip 40. It is envisioned that the reason for this is the larger area of the bottom metal contact 58 which gives rise to more carriers, as compared to the top metal contact 56. The capacitive effects of the different-size top and bottom metal contacts 56 and 58 are also believed to play a part in the instability of the breakdown voltage of the bottom pn junction 54.

It is contemplated that the semiconductor chip 67 of FIG. 11 overcomes the junction sensitivity to voltage rise time by making the top metal contact 56 and the bottom metal contact 57 substantially equal in shape and size. When there is symmetry between the areas of the top and bottom metal contacts 56 and 57, the sensitivity of the breakdown voltage of the bottom pn junction 54 to voltage rise time is substantially overcome. The etching of the bottom of the semiconductor substrate 42 as shown in FIG. 11 is carried out to assure a reliable metal contact in a DO-35 package.

Figure 12:
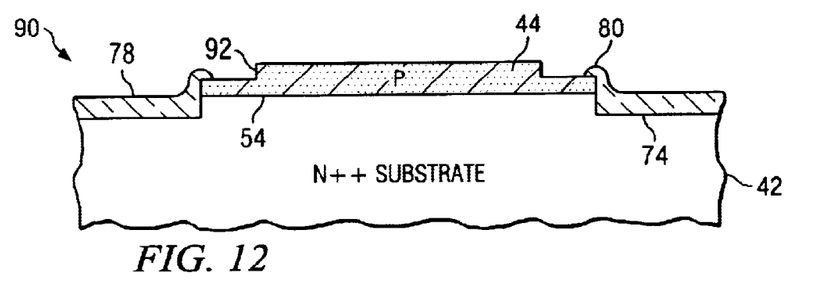
FIG. 12 is a partial cross-sectional view of a two-terminal thyristor device constructed for unidirectional operation.

While the foregoing embodiment of the invention is described in connection with a bidirectional semiconductor device, the principles and concepts of the invention can be employed to construct a unidirectional device 90 such as shown in FIG. 12. In constructing the unidirectional device 90, many of the same steps described above are carried out. However, rather than forming a pedestal top on an n-type epitaxial layer, the top n-type epitaxial layer is omitted, and the processing steps are carried out on the p-type epitaxial layer 44 to form a pedestal 92 thereon. The dopant concentrations of the p-type epitaxial layer 44 and the substrate 42 are about the same as set forth above. While not shown, metal contacts are formed on the top and bottom surfaces of the semiconductor chip 90 not covered by the glass passivation material 78.

The pn junction 54 functions in a conventional forward-biased manner when the p-type epitaxial layer 44 is biased positive with respect to the substrate 42. When the n-type substrate 42 is biased positive with respect to the p-type epitaxial layer 44, the pn junction 54 is reverse biased until the avalanche breakdown voltage is reached. When the avalanche breakdown voltage of the pn junction 54 is exceeded, the semiconductor chip 90 then enters into its negative resistance region to provide a lower voltage across the semiconductor chip 90. In this mode of operation, the unidirectional device functions somewhat like a Zener diode, except that it is characterized by a negative resistance region of operation. The bottom metal contact (not shown) that is formed on the unidirectional device 90 can be matched in surface area with the top metal contact (not shown) much like that described above in connection with the embodiment of FIG. 11.

Figure 13:
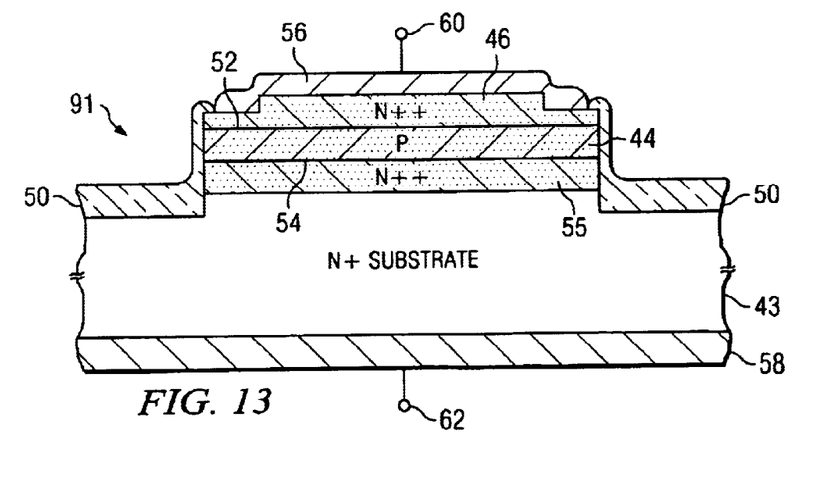
FIG. 13 is a cross-sectional view of yet another embodiment of the invention employing three epitaxial layers formed on a semiconductor substrate.

FIG. 13 illustrates another embodiment of the invention incorporating three epitaxial layers formed on a semiconductor substrate 43. The semiconductor chip 91 is constructed in the same manner as that described above in connection with the semiconductor chip 40 of FIG. 4, except for the additional epitaxial layer 55 and a different semiconductor substrate 43.

The semiconductor substrate 43 is preferably an n-type silicon material with a suitable resistivity, on the order of about 0.02 ohm*cm to about 0.05 ohm*cm. The concentration of n-type dopants in the semiconductor substrate 43 is less than the n-type dopant concentration of the epitaxial layers 46 and 55. The thickness of the semiconductor substrate 43 can be of any suitable thickness to achieve an overall wafer thickness, including the epitaxial layers, of about 240 microns, as measured after the wafer lapping step. As such, the semiconductor wafer is less critical and can be an off-the-shelf wafer.

The epitaxial layer 55 is formed on the semiconductor substrate 43 as a heavily doped n-type layer. The n-type dopant can be arsenic, distributed in the epitaxial layer 55 during the epi process so as to achieve a resistivity of about 0.003 ohm*cm to about 0.005 ohm*cm. The epitaxial layer 55 functions in an electrical manner much like the semiconductor substrate 42 of the semiconductor chip 40 shown in FIG. 4. By providing epitaxial layers 46 and 55 on both sides of the middle epitaxial p-type layer 44, the breakdown voltage of both pn junctions 52 and 54 is more closely matched, and thus more symmetrical. In order to ensure a higher degree of symmetry in the electrical operation of the bidirectional semiconductor device 91, the bottom metal contact can be constructed with an area similar in size as the top metal contact, such as described above in connection with the semiconductor chip 67 of FIG. 11.

Figure 14:
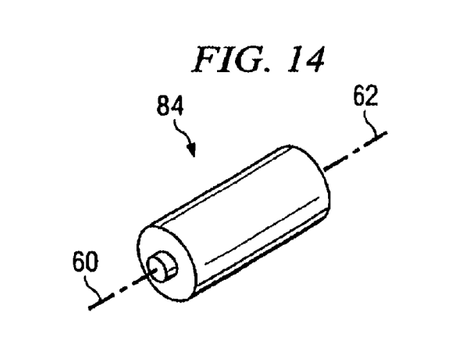
FIG. 14 is an isometric view of a packaged two-terminal thyristor device.

The semiconductor chips 40, 66, 67, 90 and 91 can be packaged in many different forms, one shown in FIG. 14 as a DO-35 package 84 having axial terminals 60 and 62. Indeed, the semiconductor devices can be integrated in chips with other semiconductor circuits.

Figure 15:
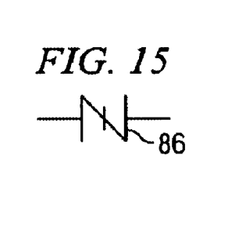
FIG. 15 symbolically depicts a two-terminal sidac device.
Figure 16:
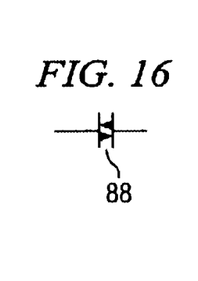
FIG. 16 symbolically depicts a two-terminal diac device.

The semiconductor chips 40, 66, 67 and 91 are constructed for operating in a bidirectional manner, in that they provide positive and negative breakover voltage thresholds, as well as corresponding negative resistance regions 26a and 26b, as shown in FIG. 2. This makes the semiconductor chips well adapted for use as an overvoltage protection device, such as a sidac 86 symbolically shown in FIG. 15, as well as a trigger device, such as a diac 88, symbolically shown in FIG. 16. The semiconductor chips can also be employed in many other applications where a specified breakover voltage is desired, together with a negative resistance region.

The foregoing semiconductor chips can also be constructed with epitaxial layers 44 and 46 to provide a semiconductor device without a negative resistance region 26. In order to reduce the negative resistance region, the middle epitaxial layer 44 should be made thicker so that the minority carriers recombine in such layer 44. When the minority carriers recombine in the middle epitaxial layer 44, they do not have an opportunity to become accelerated sufficiently to produce impact ionization with the silicon atoms. As a result, the voltage-current curve for such a device would resemble that of back-to-back Zener diodes.

Figure 17:
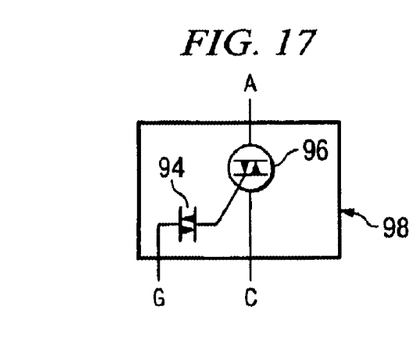
FIG. 17 is a diagram of a device in which a diac is integrated into the gate circuit of a gated thyristor.

The two-terminal thyristor device, such as shown in FIG. 4, can be integrated into the gate circuit of a gated thyristor to thereby provide both devices in a single package. As shown in FIG. 17, a diac 94 is connected to a gate circuit of a triac 96. Both the diac 94 and the triac 96 are packaged together in a single case or package 98. With this arrangement, the mounting of two separate devices is eliminated, together with the interconnecting wiring to connect the diac to a gated thyristor. The diac 94 can be integrated together with an SCR as well as other devices that are typically triggered by diacs.

From the foregoing, disclosed in one embodiment is a three-layer semiconductor device which utilizes two epitaxial layers to provide accurate control over thickness and doping concentrations therein, as well as to provide a negative resistance region of operation. In this embodiment of the invention, two epitaxial layers are used together with a semiconductor substrate to provide two symmetrical pn junctions and corresponding symmetrical bidirectional operation. By utilizing a thin epitaxial middle layer, a low breakover voltage can be achieved, together with a large break back in the negative resistance region of operation. By utilizing one or more epitaxial layers, all the advantages can be achieved without concern of the thickness of the substrate and corresponding breakage of wafers.

In another embodiment, disclosed is a unidirectional thyristor device having a negative resistance region of operation. In this embodiment, a thin epitaxial layer of material is formed on a semiconductor substrate. In this embodiment, the device functions as a diode with a negative resistance region.

While the preferred and other embodiments of the invention have been disclosed with reference to specific circuit and semiconductor structures, and methods of fabrication thereof, it is to be understood that many changes in detail may be made as a matter of engineering choices without departing from the spirit and scope of the invention, as defined by the appended claims.

What is claimed is:

1. A semiconductor device, comprising:
    a semiconductor material doped with an impurity of a first polarity;
    an epitaxial layer formed on said semiconductor material, said epitaxial layer doped with an impurity of a second polarity that is opposite said first polarity, said epitaxial layer having a thickness sufficient for providing avalanche breakdown;
    a semiconductor layer formed on said epitaxial layer, said semiconductor layer being doped with an impurity of the same polarity as said semiconductor material; and
    a first pn junction formed between said semiconductor material and said epitaxial layer, and a second pn junction formed between said epitaxial layer and said semiconductor layer.

2. The semiconductor device of claim 1, wherein said semiconductor layer comprises epitaxial semiconductor material defining a second epitaxial layer.

3. The semiconductor device of claim 2, wherein said second epitaxial layer has a dopant concentration about the same as a dopant concentration of said semiconductor material.

4. The semiconductor device of claim 1, wherein said semiconductor material has a doping concentration sufficient to achieve a resistivity between about 0.003 ohm*cm and 0.005 ohm*cm.

5. The semiconductor device of claim 1, wherein said epitaxial layer is formed with a dopant concentration between about 0.6 ohm*cm and 0.8 ohm*cm.

6. The semiconductor device of claim 1, wherein said semiconductor device has only three semiconductor layers defined by said semiconductor material, said semiconductor layer and said epitaxial layer.

7. The semiconductor device of claim 1, wherein said first pn junction and said second pn junction are formed to function as avalanche breakdown junctions in response to respective avalanche breakdown voltages.

8. The semiconductor device of claim 7, wherein said first pn junction and said second pn junction are formed to provide semiconductor device breakover voltages between about 6 volts and 32 volts.

9. The semiconductor device of claim 1, wherein said first pn junction and said second pn junction have substantially equal reverse breakdown voltages.

10. The semiconductor device of claim 1, further including a first metallic contact formed in electrical contact with said semiconductor material, and a second metallic contact formed in electrical contact with said semiconductor layer.

11. The semiconductor device of claim 10, wherein said semiconductor device has only two terminals, a first terminal connected to said first metallic contact, and a second terminal connected to said second metallic contact.

12. The semiconductor device of claim 1, further including in combination a gated thyristor, wherein said semiconductor device is connected for triggering said gated thyristor.

13. The semiconductor device of claim 1, wherein said epitaxial layer is formed with a first dopant concentration in a portion thereof that is adjacent said substrate, and said epitaxial layer is formed with a second dopant concentration in a portion thereof that is adjacent said semiconductor layer, said first and second dopant concentrations being different as a result of different respective epitaxial processes.

14. The semiconductor device of claim 13, wherein said first dopant concentration is greater than said second dopant concentration.

15. The semiconductor device of claim 1, wherein said semiconductor material comprises a semiconductor substrate.

16. The semiconductor device of claim 1, wherein said epitaxial layer defines a first epitaxial layer, and wherein said semiconductor material comprises a second epitaxial layer of material doped with an impurity and concentration substantially the same as said first epitaxial layer.

17. The semiconductor device of claim 1, wherein a first metal contact of a given area is formed on semiconductor material on one side of said semiconductor device, and a second contact of substantially the same area as said given area is formed on semiconductor material on an opposite side of said semiconductor device.

18. A semiconductor device, comprising:
    a semiconductor material substrate;
    a first epitaxial layer of a semiconductor formed on said semiconductor material, said first epitaxial layer having a thickness suitable for providing avalanche breakdown thereof;

a first pn junction formed at an interface between said semiconductor material and said first epitaxial layer, said first pn junction formed to provide a given breakdown voltage;

a second epitaxial layer of a semiconductor formed on said first epitaxial layer;

a second pn junction formed at an interface between said first epitaxial layer and said second epitaxial layer, said second pn junction formed to provide said given breakdown voltage;

a first metallic contact formed on said semiconductor device, and a first terminal connected to said first metallic contact; and a second metallic contact formed on a surface of said second epitaxial layer, and a second terminal connected to said second metallic contact.

19. The semiconductor device of claim 18, wherein said given breakdown voltage is in a range of about 6–32 volts.

20. The semiconductor device of claim 18, wherein said semiconductor material and said second epitaxial layer are doped with an n-type dopant, and said first epitaxial layer is doped with a p-type dopant.

21. A method of forming a semiconductor device, comprising the steps of:

forming on a semiconductor material a first epitaxial layer of material so that a pn junction is formed therebetween;

forming said first epitaxial layer and said semiconductor material with opposite polarity dopants;

forming said first epitaxial layer with a thickness sufficient to provide negative resistance properties for said semiconductor device;

forming a second epitaxial layer of material on said first epitaxial layer so that a pn junction is formed therebetween; and forming said second epitaxial layer with a dopant polarity the same as that of said semiconductor material.

22. The method of claim 21, further including forming a metal contact on said second epitaxial layer.

23. The method of claim 21, further including doping the first and second epitaxial layers to provide said semiconductor device with substantially equal positive and negative breakover voltages.

24. The method of claim 21 further including using a thickness of said first epitaxial layer to achieve a breakdown voltage of a given magnitude.

25. The method of claim 21, further including forming said first epitaxial layer with different dopant concentrations therein to achieve substantially equal positive and negative breakover voltages for said semiconductor device, and including forming said different dopant concentrations by varying an epitaxial process by which said first epitaxial layer is formed.

26. The method of claim 25, further including forming a portion of the first epitaxial layer adjacent to said semiconductor material with a dopant concentration that is greater than a dopant concentration in a portion of said first epitaxial layer adjacent to said second epitaxial layer.

27. The method of claim 21, further including forming said semiconductor material as a third epitaxial layer having a dopant polarity and concentration substantially the same as said second epitaxial layer, and further including forming said third epitaxial layer on a semiconductor substrate having a dopant polarity the same as said third epitaxial layer.

28. The method of claim 27, further including forming said semiconductor substrate with a dopant concentration less than a dopant concentration of said third epitaxial layer.

29. The method of claim 21, further including forming a first metal contact on said second epitaxial layer, and further including forming a second metal contact on said semiconductor material, said first and second metal contacts having substantially the same area.

30. A semiconductor device, comprising;

at least three semiconductor layers for forming two pn junctions, two of said semiconductor layers being of one type dopant polarity, and another semiconductor layer being of an opposite type dopant polarity and formed by an epitaxial layer of semiconductor material;

material characteristics of said semiconductor layers selected and arranged so as to exhibit substantially equal breakover voltages of said pn junctions, and so that one pn junction is forward biased when a voltage of a given polarity is applied across the semiconductor device, and so that the other pn junction is forward biased when a voltage of an opposite polarity is applied across the semiconductor device;

a first metal contact formed on one side of said semiconductor device in electrical contact with one said semiconductor layer;

a second metal contact formed on an opposite side of said semiconductor device in electrical contact with another said semiconductor layer; and said first and said second metal contacts constructed with substantially the same size surface areas to provide symmetry of the breakdown voltages of said pn junctions.

31. The semiconductor device of claim 30, wherein at least two of said semiconductor layers are formed as respective first and second epitaxial layers.

32. The semiconductor device of claim 31, wherein one said semiconductor layer comprises a semiconductor substrate, and one said metal contact is formed on said semiconductor substrate.

33. The semiconductor device of claim 30, further including in combination masks having substantially the same size and shape openings therein, said masks applied to opposite sides of said semiconductor device for depositing respective said first and second metal contacts.

34. The semiconductor device of claim 30, wherein said epitaxial layer is thin to thereby produce a breakover voltage lower than about 32 volts.

* * * * *